United States Patent [19]
Pyeon

[11] Patent Number: 5,672,996
[45] Date of Patent: Sep. 30, 1997

[54] SUBSTRATE VOLTAGE SUPPLY CONTROL CIRCUIT FOR MEMORY

[75] Inventor: Hong Beom Pyeon, Choongchungbook-Do, Rep. of Korea

[73] Assignee: LG Semicon Co., Ltd., Cheongju, Rep. of Korea

[21] Appl. No.: 576,381

[22] Filed: Dec. 21, 1995

[30] Foreign Application Priority Data

Oct. 12, 1995 [KR] Rep. of Korea .......................... 35145

[51] Int. Cl.$^6$ .......................................................... G11C 5/14
[52] U.S. Cl. ........................... 327/534; 327/536; 365/226
[58] Field of Search .............................. 327/534, 535, 327/536, 537; 365/226

[56] References Cited

U.S. PATENT DOCUMENTS

| | | | |
|---|---|---|---|
| 4,585,955 | 4/1986 | Uchida | 365/226 |
| 4,654,829 | 3/1987 | Jiang et al. | 365/226 |
| 4,806,789 | 2/1989 | Sakihama et al. | 365/226 |
| 5,257,239 | 10/1993 | Guo et al. | 365/226 |
| 5,272,393 | 12/1993 | Horiguchi et al. | 327/535 |
| 5,301,160 | 4/1994 | McAdams | 365/226 |
| 5,363,333 | 11/1994 | Tsujimoto | 365/226 |
| 5,376,840 | 12/1994 | Nakayama | 365/226 |
| 5,400,276 | 3/1995 | Takeguchi | 365/226 |
| 5,430,682 | 7/1995 | Ishikawa et al. | 365/226 |
| 5,434,820 | 7/1995 | Kim | 327/536 |
| 5,513,146 | 4/1996 | Atsumi et al. | 327/534 |
| 5,557,231 | 9/1996 | Yamamguchi et al. | 327/536 |
| 5,563,837 | 10/1996 | Noguchi | 365/226 |

OTHER PUBLICATIONS

Daisaburo Takashima et al., "Standby/Active Mode Logic for Sub–1–V Operating ULSI Memory", IEEE Journal of Solid–State Circuits, vol. 29, No. 4, Apr. 1994, pp. 441–446.

*Primary Examiner*—Terry Cunningham
*Attorney, Agent, or Firm*—Fleshner & Kim

[57] ABSTRACT

A substrate voltage supply control circuit for a memory which is capable of controlling substrate voltages having different voltage levels generated from a substrate voltage generating circuit included in the memory, so that different substrate voltages may be supplied to each circuit in memory depending on the state of each circuit, thereby reducing electrical power consumption in memory. The substrate voltage supply control circuit for a memory of the present invention includes first and second substrate voltage generating units for generating substrate voltages of high level and low level, respectively, according to a row address strobe signal, a power supply signal and an enable signal applied from the outside, and supplying the generated substrate voltage of high level to memory cells; a substrate voltage supply control unit for outputting first to fifth control signals and supplying the substrate voltages of high and low levels generated respectively by the first and second substrate voltage generating units, to each circuit inside of the memory according to the row address strobe signal and first to fourth address signals applied from the outside; and a substrate voltage selection unit for selecting substrate voltages of high and low levels generated respectively by the first and second substrate voltage generating unit according to the first to fifth control signals outputted from the substrate voltage supply control unit, and respectively supplying the selected voltages to memory peripheral circuits.

17 Claims, 6 Drawing Sheets

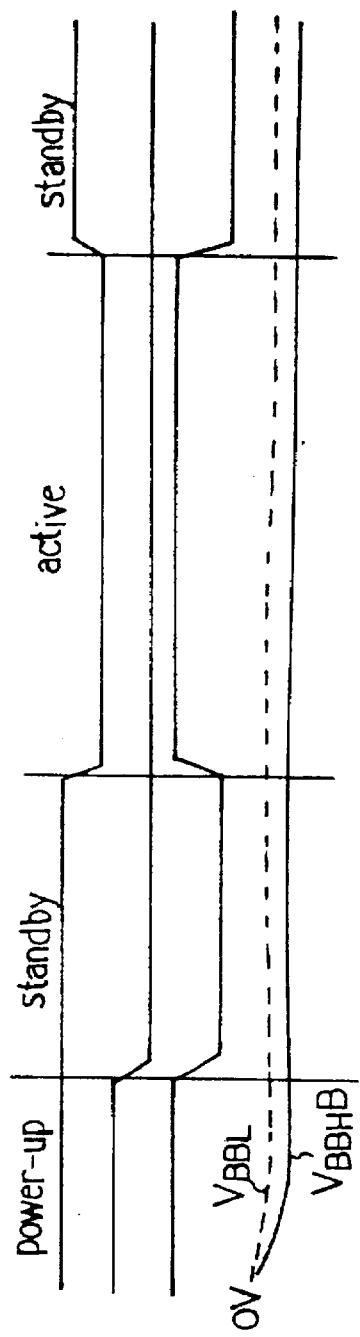

SUBSTRATE VOLTAGE SUPPLY CONTROL CIRCUIT FOR MEMORY

BACKGROUND OF THE INVENTION

1. Field of the Invention

The present invention relates to a substrate voltage supply control circuit for a memory, and particularly to an improved substrate voltage supply control circuit for a memory which is capable of controlling substrate voltages having different voltage levels generated from a substrate voltage generating circuit included in the memory, so that different substrate voltages may be supplied to each circuit in memory depending on the state of each circuit, thereby reducing electrical power consumption in memory.

2. Description of the Conventional Art

Referring to FIG. 1, a conventional voltage control circuit includes an inverter 1 for inverting voltage supplied from the outside, and an inverter 2 for inverting the inverted voltage by the inverter 1.

The inverter 1 includes a PMOS transistor Q1 having a source to which a supply voltage VDD terminal is connected, and a gate to which a voltage IV supplied from the outside is connected; an NMOS transistor Q2 having a drain to which a drain of the PMOS transistor Q1 is connected and further a common output line OL1 is connected, a gate to which a gate of the PMOS transistor Q1 is connected, and a source to which ground terminal is connected; a PMOS transistor Q3 having a source to which the supply voltage terminal is connected, and a gate to which the common output line OL1 is connected; and an NMOS transistor Q4 having a drain to which a drain of the PMOS transistor Q3 is connected and further a common output line OL2 is connected, a gate to which a gate of the PMOS transistor Q3 is connected, and a source to which the ground terminal is connected.

Both the PMOS transistor Q1 and the NMOS transistor Q4 are formed to have threshold voltages of low level. While, both the NMOS transistor Q2 and the PMOS transistor Q3 are formed to have threshold voltages of high level.

As shown in FIG. 2, another conventional voltage supply circuit includes inverters 10 to 40 for outputting a voltage OV by successively inverting the voltage IV supplied from the outside; a PMOS transistor 50 for supplying the supply voltage VDD to the inverters 20 and 40 after being switched by a control signal CS1 supplied from the outside; and an NMOS transistor 60 for controlling output levels of the inverters 10 and 30 after being switched by a control signal CS2 supplied from the outside.

The inverter 10 includes a PMOS transistor MP1 having a source to which the supply voltage VDD terminal is connected, and a gate to which the voltage IV line supplied from the outside is connected; and an NMOS transistor MN1 having a drain to which a drain of the PMOS transistor MP1 is connected and further the common output line OL1 is connected, a gate to which a gate of the PMOS transistor MP1 is connected, and a source to which a drain of the NMOS transistor 60 is connected.

The inverter 20 includes a PMOS transistor MP2 having a source to which a drain of the PMOS transistor 50 is connected, and a gate to which the common output line OL1 of the inverter 10 is connected; and an NMOS transistor MN2 having a drain to which a drain of the PMOS transistor MP2 is connected and further common output line OL2 is connected, a gate to which a gate of the PMOS transistor MP2 is connected, and a source to which ground terminal is connected.

The inverter 30 includes a PMOS transistor MP3 having a source to which the supply voltage VDD terminal is connected, and a gate to which the common output line OL2 of the inverter 20 is connected; and an NMOS transistor MN3 having a drain to which a drain of the PMOS transistor MP3 is connected and further common output line OL3 is connected, a gate to which a gate of the PMOS transistor MP3 is connected, and a source to which a drain of the NMOS transistor NM1 is connected.

The inverter 40 includes a PMOS transistor MP4 having a source to which a source of the PMOS transistor MP2 is connected, and a gate to which the common output line OL3 of the inverter 30 is connected; and an NMOS transistor MN4 having a drain to which a drain of the PMOS transistor MP4 is connected and further common output line OL4 is connected, and a source to which the ground terminal is connected.

The PMOS transistors MP1 to MP4 and the NMOS transistor MN1 to MN4 have threshold voltages of low level.

FIG. 3 is a section diagram of CMOS to explain level control of the substrate voltage supplied to each circuit of the conventional memory device.

Here, VBB is a substrate voltage and fo is a field oxide. The reference numerals NG, NS and ND indicate a gate, a source, and a drain of the NMOS transistor, respectively, and PC, PS and PD indicate a gate, a source, and a drain of the PMOS transistor, respectively.

The conventional voltage supply control circuit for a memory is illustrated as follows.

First, the operation of the circuit will be explained referring to FIG. 1. If the low voltage IV applied from the outside is supplied in standby state, the PMOS and NMOS transistors Q1 and Q2 receive at each gate the low voltage IV supplied from the outside, and are turned on and turned off, respectively, thereby high voltage is outputted via the common output line OL1.

Afterwards, the PMOS transistor Q3 and the NMOS transistor Q4 of the inverter 2 commonly receive at each gate the high voltage outputted via the common output line OL1 of the inverter1, and are turned off and turned on, respectively, thereby the output voltage OV is outputted via the common output line OL2 of the inverter.

In active state, the inverters 1 and 2 perform the contrary operations as described above for the standby state, and high level voltage is outputted via the common output line OL2.

The NMOS and PMOS transistors Q2 and Q3 having threshold voltages of high level in standby state are turned off in order to prevent the leakage current of the subthreshold, and the PMOS and NMOS transistors Q1 and Q4 having threshold voltages of low level are turned on in order to reduce the delay of the gate.

Another voltage supply control circuit as shown in FIG. 2 will be explained as follows. When the voltage IV of low level is supplied from the outside in standby state, and when the control signal CS1 of high level and the control signal CS2 of low level are inputted from the outside, the PMOS transistors 50 and 60 receive at each gate the inputted signals CS1 and CS2 and are turned off, respectively.

The PMOS and NMOS transistors MP1 and MN1 of the inverter 10 commonly receive at each gate the low voltage IV supplied from the outside, and are turned on and truned off, respectively, thereby high voltage is outputted via the common output line OL1.

The PMOS and NMOS transistors MP2 and MN2 of the inverter 20 receive at each gate the high voltage outputted via the common output line OL1 of the inverter 10, and are turned off and turned on, respectively, thereby low voltage is outputted via the common output line OL2.

The PMOS and NMOS transistors MP3 and MN3 of the inverter 30 receive at each gate low voltage outputted via the common output line OL2 of the inverter 20, and are turned on and turned off, respectively, thereby high voltage is outputted via common output line OL3.

Therefore, the PMOS and NMOS transistors MP4 and MN4 of the inverter 40 receive at each gate high voltage outputted via the output voltage OL3, and are turned off and turned on, respectively, thereby low voltage OV is outputted via common output line OL4.

As it is difficult to construct a substrate voltage supply control circuit which enables the transistor having threshold voltage of high level to be turned off in standby state, level control of the substrate voltage VBB supplied from the external substrate voltage generation circuit is controlled by the process as shown in FIG. 3.

However, the process of the conventional invention has a problem in that it is very difficult to control the supply of the substrate voltage because the level control of the substrate voltage supplied from the external substrate voltage generating circuit is controlled by a process. Furthermore, since controlling the supply of the substrate voltage is difficult and controlling the threshold voltage of the MOS transistor including each circuit of the memory is not easy, the substrate voltage of low level is applied to each part of the memory in standby state, thereby resulting in waste of electric power.

Additionally, since the same level of the substrate voltage is supplied to both the selected path and the non-selected path when decoding in active state, much electric power is consumed inside of the memory device.

SUMMARY OF THE INVENTION

Therefore, it is an object of the present invention to provide a substrate voltage supply control circuit which is capable of reducing the electric power in the memory by controlling the substrate voltage having different voltage levels generated from a substrate voltage generating circuit included in the memory, so that different substrate voltages may be supplied to each circuit in memory depending on the state of each circuit, thereby reducing electrical power consumption in memory To achieve the above object, the substrate voltage supply control circuit according to the present invention includes first and second substrate voltage generating means for generating substrate voltages of high level and low level, respectively, according to a row address strobe signal, a power supply signal and an enable signal applied from the outside, and supplying the generated substrate voltage of high level to memory cells; a substrate voltage supply control means for outputting first to fifth control signals and supplying the substrate voltages of high and low levels generated respectively by the first and second substrate voltage generating means, to each circuit inside of the memory according to the row address strobe signal and first to fourth address signals applied from the outside; and a substrate voltage selection means for selecting substrate voltages of high and low levels generated respectively by the first and second substrate voltage generating means according to the first to fifth control signals outputted from the substrate voltage supply control means, and respectively supplying the selected voltages to a word line driver, an x-decoder, a y-decoder and memory peripheral circuits.

BRIEF DESCRIPTION OF DRAWINGS

The above object and advantages of the present invention will be more clearly understood from the following detailed description taken in conjunction with the accompanying drawings, in which;

FIGS. 9A to 9D are wave forms showing input/out of FIG. 1 according to the state of memory.

DETAILED DESCRIPTION OF THE PREFERRED EMBODIMENTS

Figure 1:
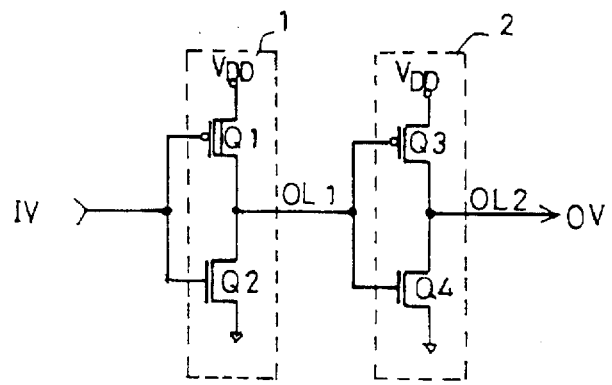
FIG. 1 shows a conventional voltage supply control circuit.
Figure 2:
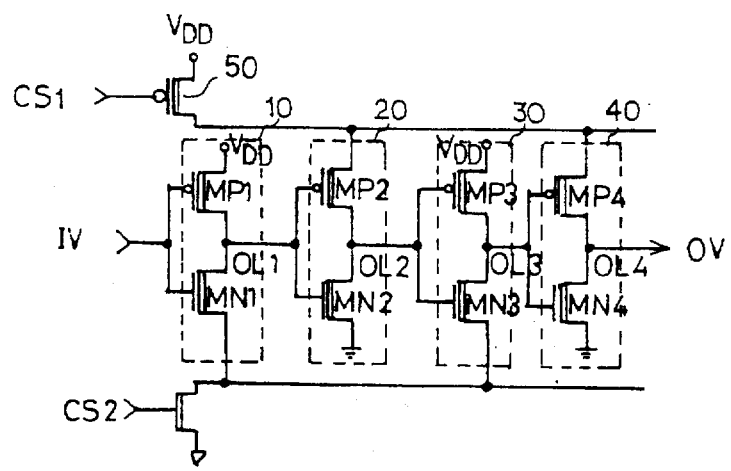
FIG. 2 shows another conventional voltage supply control circuit.
Figure 3:
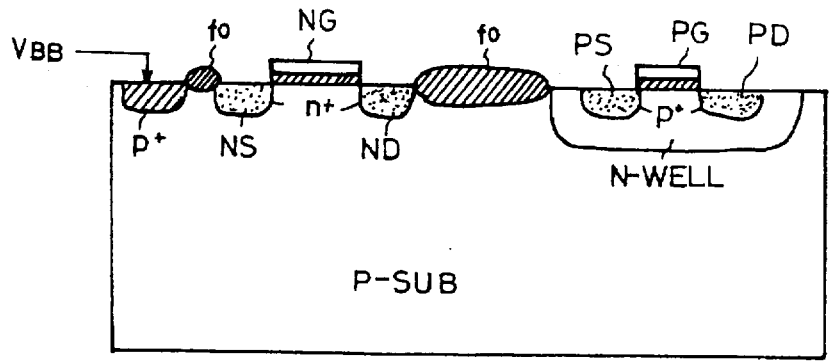
FIG. 3 is a section diagram showing a level control of substrate voltage supplied to the conventional memory.
Figure 4:
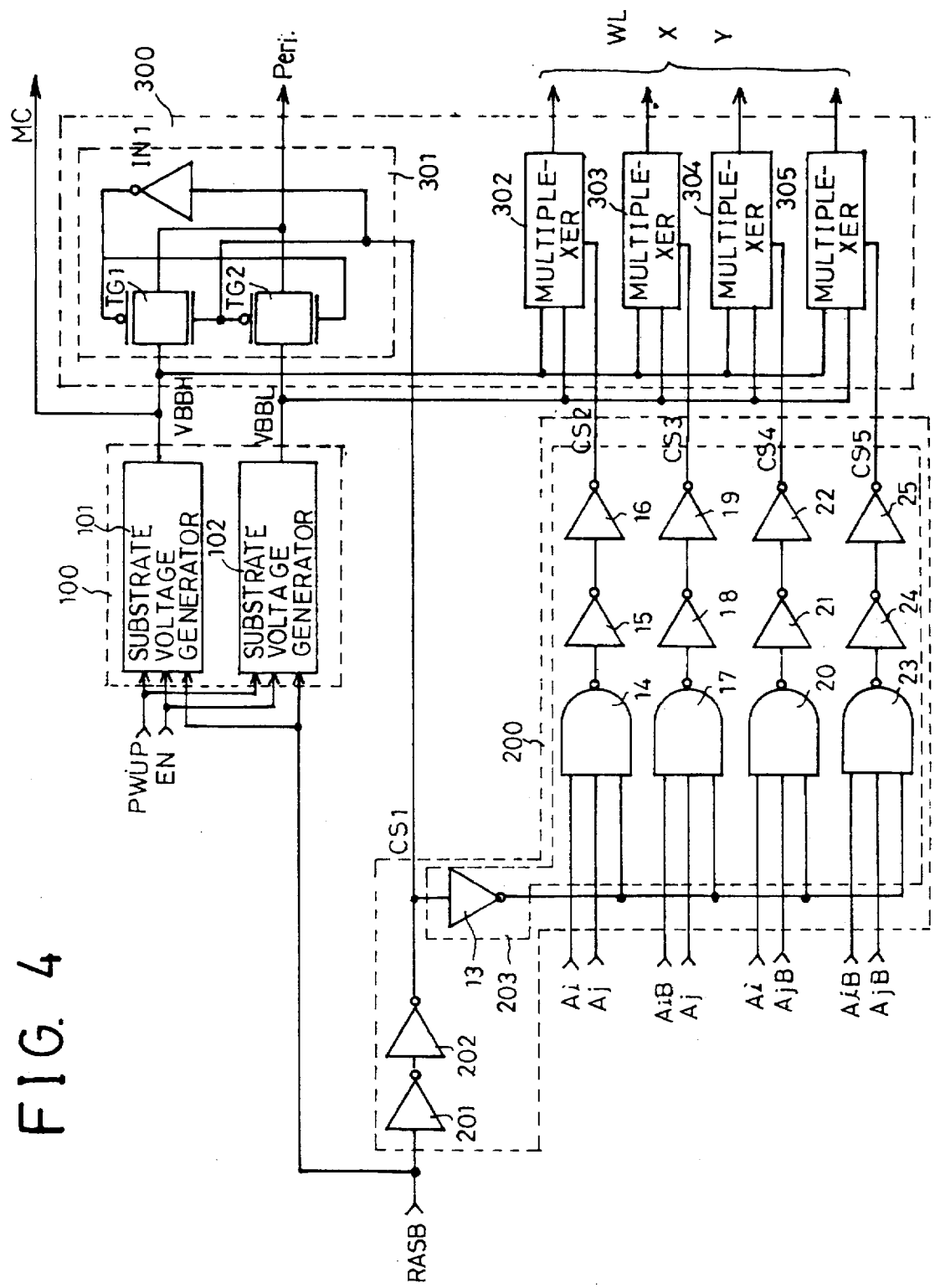
FIG. 4 shows a substrate voltage supply control circuit for a memory in accordance with the present invention.

Referring to FIG. 4, the substrate voltage supply control circuit for a memory according to the present invention includes a substrate voltage generating unit 100 for respectively generating high substrate voltage of high level VBBH and having substrate voltage of low level VBBL according to a row address strobe signal RASB, a power supply signal PWUP and an enable signal EN applied from the outside, and for supplying the generated substrate voltage of high level VBBH to a memory cell MC; a substrate voltage supply control unit 200 for outputting control signals CS1 to CS5 so that the substrate voltages VBBH and VBBL respectively generated by the substrate voltage generating unit 100 according to the row address strobe signal RASB and the address signals Ai, Aj; AiB, Aj; Ai, AjB; and AiB, AjB can be supplied to the internal circuit of the memory; and a substrate voltage selection unit 300 for selecting the substrate voltages VBBH and VBBL respectively generated in the substrate voltage generating unit 100 in accordance with the control signals CS1 to CS5 outputted from the substrate voltage supply control unit 200, and respectively outputting the substrate voltages to the word line driver WL, x-decoder X, y-decoder Y, and memory peripheral circuit peri..

The substrate voltage generating unit 100 includes a substrate voltage generator 101 for generating the high substrate voltage VBBH by the signals PWUP, EN, and RASB which are applied from the outside; and a substrate voltage generating unit 102 for generating the low substrate voltage VBBL by the signals PWUP, EN and RASB.

The substrate voltage control unit 200 includes inverters 201 and 202 for successively inverting the signal RASB inputted from the outside, and outputting the control signal CS1; and a decoder 203 for decoding the address signals Ai, Aj; AiB, Aj; Ai, AjB; and AiB, AjB inputted from the outside in accordance with the control signal CS1 outputted from the inverter 202, and outputting the control signals CS1 to CS4.

The substrate voltage selection unit 300 includes a multiplexer 301 for selecting one of the substrate voltages VBBH and VBBL respectively outputted from the substrate voltage generating unit 100 in accordance with the control signal CS1 outputted from the substrate voltage supply control unit 200, and supplying it to the peripheral circuit inside of the memory; and multiplexers 302 to 305 for selecting one of the substrate voltages $V_{BBH}$ and $V_{BBL}$ generated by the substrate voltage generating unit 100 in accordance with the control signals CS2 to CS5 outputted from the substrate voltage supply control unit 200, and supplying it respectively to the word line driver WL, x-decoder X and y-decoder Y.

The decoder 203 includes an inverter 13 for inverting the signal inverted by the inverter 202; a NANED gate 14 for NANDing the signal inverted by the inverter 13 and the address signals Ai and Aj inputted from the outside; inverters 15 and 16 for successively inverting successively inverting the signal outputted from the NAND gate 14 and outputting control signal CS2; a NAND gate 17 for NANDing the signal inverted by the inverter 13 and the address signals AiB and Aj inputted from the outside; inverters 18 and 19 for successively inverting the signal outputted from the NAND gate 17 and outputting the control signal CS3; a NAND gate 20 for NANDing the signal outputted from the inverter 13 and the address signals Ai and AjB inputted from the outside; inverters 21 and 22 for successively inverting the signal outputted from the NAND gate 20 and outputting control signal CS4; a NAND gate 23 for NANDing the signal outputted from the inverter 13 and the address signals AiB and AjB inputted from the outside; and inverters 24 and 25 for successively inverting the signal outputted from the NAND gate 23 and outputting control signal CS5.

The multiplexers 301 to 305 includes transmission gates TG1 and TG2 for respectively transmitting the substrate voltages $V_{BBH}$ and $V_{BBL}$ generated by the substrate voltage generating unit 100 in accordance with the control signal outputted from the voltage supply control unit 200 and the control signals CS1 to CS5 outputted from the voltage supply control unit 200.

Figure 5:
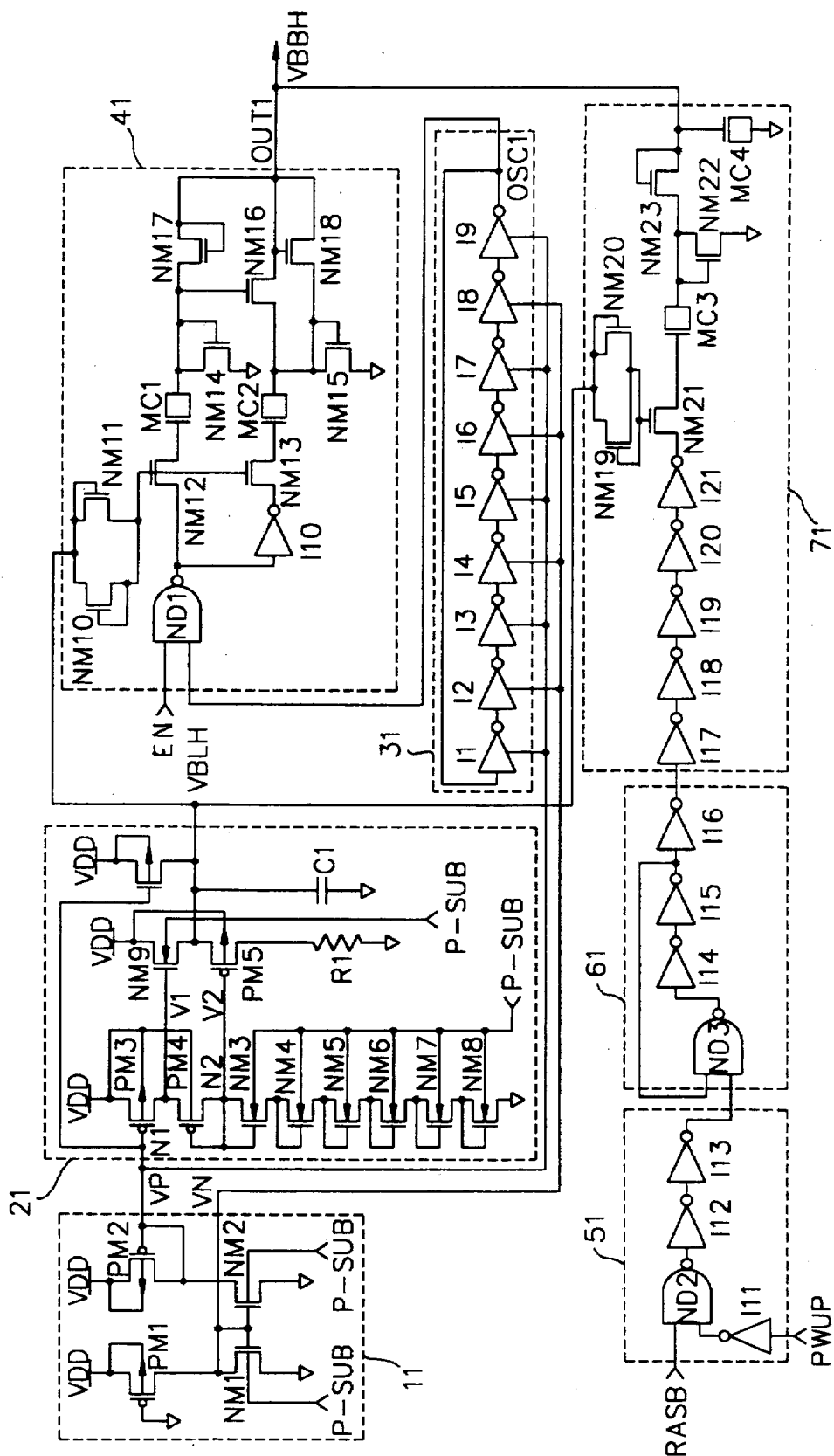
FIG. 5 is a detailed circuit diagram of FIG. 4.

As shown in FIG. 5, a detailed circuit of the substrate voltage generator 101 includes a bias voltage generator 11 for generating bias voltages VP and VN; a clamping voltage generating unit 21 for clamping the bias voltage VP generated by the bias voltage generator 11, and generating a high voltage $V_{BLH}$; an oscillator 31 for outputting an oscillation signal OSC1 by being oscillated in standby and active states in accordance with the bias voltages VP and VN generated by the bias voltage generator 11, respectively; a pumping circuit 41 for logically operating the signal OSC1 oscillated by the oscillator 31 and an enable signal EN applied from the outside, and outputting the high substrate voltage $V_{BBH}$ by pumping the logically operated signal in accordance with the high voltage $V_{BLH}$ generated by the clamping voltage generator 21; a logic operator 51 for logically operating the signals RASB and PWUP supplied from the outside; an oscillator 61 being oscillated in accordance with the signal which is logically operated in the logic operator 51 in active state; and a voltage pumping circuit 71 for outputting the high substrate voltage $V_{BBH}$ by pumping the voltage oscillated in the oscillator 61 in accordance with the voltage $V_{BLH}$ generated by the clamping voltage generator 21.

The bias voltage generator 11 includes a PMOS transistor PM1 having a source to which a supply voltage $V_{DD}$ terminal is connected, and a gate to which a ground terminal is connected; an NMOS transistor NM1 having a drain to which a drain of the PMOS transistor PM1 is connected and further an output voltage VN line is connected, a gate to which the output voltage VN line is connected, and a source to which the ground terminal is connected; a PMOS transistor PM2 having a source to which the supply voltage $V_{DD}$ terminal is connected, and a gate to which its own drain is connected and further output voltage VP line is connected; and an NMOS transistor NM2 having a drain to which the drain of the PMOS transistor PM2 is connected, a gate to which the gate of the NMOS transistor NM1 is connected, and a source to which the ground terminal is connected.

The clamping voltage generator 21 includes a PMOS transistor PM3 having a source to which the supply voltage $V_{DD}$ terminal is connected, and a gate to which the output voltage V2 line is connected; a PMOS transistor PM4 having a source to which a drain of the PMOS transistor PM3 is connected and further output voltage V1 line is connected, and a gate to which its own drain is connected; an NMOS transistor NM3 having a drain to which the drain of the PMOS transistor PM4 is connected and further output voltage V2 line is connected, and a gate to which its own drain is connected; an NMOS transistor NM4 having a drain to which a source of the NMOS transistor NM3 is connected, and a gate to which its own drain is connected; an NMOS transistor NM5 having a drain to which a source of the NMOS transistor NM4 is connected, and a gate to which its own drain is connected; an NMOS transistor NM6 having a drain to which a source of the NMOS transistor MN5 is connected, and a gate to which its own drain is connected; an NMOS transistor NM7 having a drain to which a source of the NMOS transistor NM6 is connected, and a gate to which its own drain is connected; an NMOS transistor NM8 having a drain to which a source of the NMOS transistor NM7 is connected, a gate to which its own drain is connected, and a source to which the ground terminal is connected; an NMOS transistor NM9 having a drain to which the supply voltage $V_{DD}$ terminal is connected, and a gate to which the output voltage V1 line is connected; a PMOS transistor PM5 having a source to which a source of the NMOS transistor NM9 is connected and further the output voltage $V_{BLH}$ line is connected, and a gate to which the output voltage V2 line is connected; a resistor R1 having one end to which the source of the PMOS transistor PM5 is connected, and the other end to which the ground terminal is connected; a capacitor C1 being connected in parallel between the output voltage $V_{BLH}$ and the ground terminal; and a PMOS transistor PM6 having a source to which the supply voltage $V_{DD}$ terminal is connected, a gate to which the output voltage VP line is connected, and a drain to which the output voltage $V_{BLH}$ line is connected.

The oscillator 31 includes an inverter I1 for inverting the signal OSC1 inputted by voltage VP generated by the bias voltage generator 11; an inverter I2 for inverting the signal which is inverted in the inverter I1 by voltage VN generated in the bias voltage generator 11; an inverter I3 for inverting the signal inverted in the inverter I2 by the voltage VP generated in the bias voltage generator 11; an inverter I4 for inverting the signal inverted in the inverter I3 by the voltage VN generated in the bias voltage generator 11; an inverter I5 for inverting the signal inverted in the inverter I4 by the voltage VP generated in the bias voltage generator 11; an inverter I6 for inverting the signal inverted in the inverter I5 by the voltage VN generated in the bias voltage generator 11; an inverter I7 for inverting the signal inverted in the inverter I6 by the voltage VP generated in the bias voltage generator 11; an inverter I8 for inverting the signal inverted in the inverter I7 by the voltage VN generated in the bias voltage generator 11; and an inverter I9 for inverting the signal inverted in the inverter I8 by the voltage VP generated in the bias voltage generator 11.

The voltage pumping circuit 41 includes a NAND gate ND1 having one input terminal to which the signal OSC1 outputted from the oscillator 31 is connected, and the other input terminal to which the signal EN inputted from the outside is connected; an inverter I10 having an input terminal to which output terminal of the NAND gate ND1 is connected; an NMOS transistor NM10 having a drain to which the output voltage VBLH line of the clamping voltage generator 21 is connected, and a gate to which its own source is connected; an NMOS transistor NM11 having a drain to which the drain of the NMOS transistor 10 is connected and further its own gate is connected, and a source to which the source of the NMOS transistor NM10 is connected; an NMOS transistor NM12 having a drain to which output terminal of the NAND gate ND1 is connected, and a gate to which each source of the NMOS transistors NM10 and NM11 is commonly connected; an NMOS transistor NM13 having a drain to which output terminal of the inverter I10 is connected, and a gate to which the gate of the NMOS transistor NM12 is connected; a MOS capacitor MC1 having a gate to which a source of the NMOS transistor NM12 is connected; a MOS capacitor MC2 having a gate to which a source of the NMOS transistor NM13 is connected; an NMOS transistor NM14 having a drain to which a drain-source of the MOS capacitor MC1 is connected, a gate to which its own drain is connected, and a source to which the ground terminal is connected; an NMOS transistor NM15 having a drain to which a drain-source of the MOS capacitor MC2 is connected, a gate to which its own drain is connected, and a source to which the ground terminal is connected; an NMOS transistor NM16 having a drain to which the drain of the NMOS transistor NM15 is connected, and a gate to which the gate of the NMOS transistor NM14 is connected; an NMOS transistor NM17 having a drain to which the gate of the NMOS transistor NM16 is connected, and a gate to which its own source is connected; and an NMOS transistor NM18 having a drain to which the gate of the NMOS transistor NM15 is connected, a gate to which a source of the NMOS transistor NM16 is connected, and a source to which its own gate is connected and further the output voltage VBBH line is connected.

The logic operator 51 includes a NAND gate ND2 for NANDing the signal RASB inputted from the outside and the signal inverted by the inverter I11; and inverters I12 and I13 for inverting successively the signal outputted from the NAND gate ND2.

The oscillator 61 includes a NAND gate ND3 for NANDing the signal outputted from the logic operator 51 and the signal inputted after being fed back; inverters I14 and I15 for inverting the signal outputted from the NAND gate ND3, and outputting the inverted signal to the NAND gate ND3; and an inverter 116 for inverting the signal outputted from the inverter I15.

The voltage pumping circuit 71 includes inverters I17 to I21 for successively inverting the signal outputted from the oscillator 61; an NMOS transistor NM19 having a drain to which the output voltage VBLH line of the clamping voltage generator 21 is connected, and a gate to which its own source is connected; an NMOS transistor NM20 having a drain to which the drain of the NMOS transistor NM19 is connected, a gate to which its own drain is connected, and a source to which the source of the NMOS transistor NM19 is connected; an NMOS transistor NM21 having a drain to which output terminal of the inverter I21 is connected, and a gate to which each source of the NMOS transistor NM19 and NM20 is commonly connected; a MOS capacitor MC3 having a gate to which a source of the NMOS transistor NM21 is connected; an NMOS transistor NM22 having a drain to which a drain-source of the MOS capacitor MC3 is connected, a gate to which its own drain is connected, and a source to which ground terminal is connected; an NMOS transistor NM23 having a drain to which the drain of the NMOS transistor NM22 is connected, and a gate to which its own source is connected; and a MOS capacitor MC4 being connected in parallel between the gate of the NMOS transistor NM23 and the ground terminal, and further connected to the output voltage VBBH line.

Figure 6:
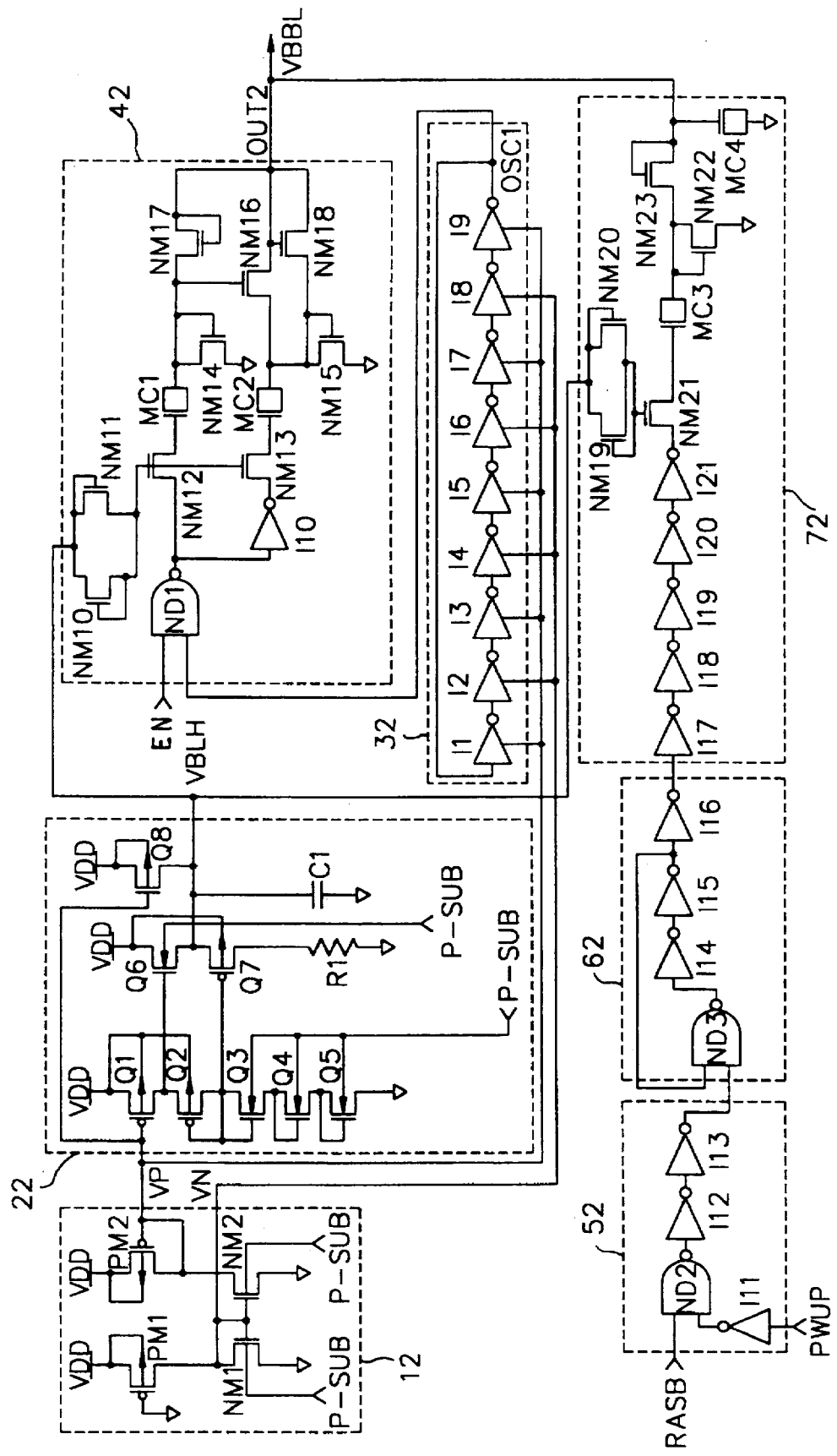
FIG. 6 is another detailed circuit diagram of FIG. 4.

As shown in FIG. 6, a detailed circuit of the substrate voltage generator 102 of FIG. 4 includes a bias voltage generator 12 for generating bias voltages VP and VN; a clamping voltage generating unit 22 for clamping the bias voltage VP generated by the bias voltage generator 12, and generating a prescribed low voltage VBLL; an oscillator 32 being oscillated in standby and active states in accordance with the bias voltages VP and VN generated by the bias voltage generator 12, and outputting oscillation signal OSC1; a voltage pumping circuit 42 for logically operating the signal OSC1 oscillated in the oscillator 32 with an enable signal EN applied from the outside, and outputting a prescribed low substrate voltage VBBL by pumping the logically operated signal by the low voltage VBLL generated in the clamping voltage generator 22; a logic operator 52 for logically operating the signals RASB and PWUP supplied from the outside; an oscillator 62 being oscillated in accordance with the signal which is logically operated in the logic operator 52 in active state; and a voltage pumping circuit 72 for outputting a prescribed low substrate voltage VBBL by pumping the voltage oscillated in the oscillator 62 by the voltage VBLL generated in the voltage generator 22.

The clamping voltage generator 22 includes a PMOS transistor Q1 having a source to which the supply voltage VDD line is connected, and a gate to which the output voltage VP line is connected; a PMOS transistor Q2 having a source to which a drain of the PMOS transistor Q1 is connected and further an output voltage V3 line is connected, and a gate to which its own drain is connected; an NMOS transistor Q3 having a drain to which a drain of the PMOS transistor Q2 is connected and further an output voltage V4 line is connected, and a gate to which its own drain is connected; an NMOS transistor Q4 having a drain to which a source of the NMOS transistor Q3 is connected, and a gate to which its own drain is connected; an NMOS transistor Q5 having a drain to which a source of the NMOS transistor Q4 is connected, and a gate to which its own drain is connected; an NMOS transistor Q6 having a drain to which the supply voltage VDD line is connected, and a gate to which the output supply V3 line is connected; a PMOS transistor Q7 having a source to which a source of the NMOS transistor Q6 is connected and further the output voltage VBLL line is connected, and a gate to which the output voltage V4 line is connected; a resistor R having one end to which the source of the PMOS transistor Q7 is connected, and the other end to which the ground terminal is connected; a capacitor C being connected in parallel between the output voltage VBLL and the ground terminal; and a PMOS transistor Q8 having a source to which the supply voltage VDD terminal is connected, a gate to which the output voltage VP line is connected, and a drain to which the output voltage VBLL line is connected.

Since the other constructions of the substrate voltage generator 102 are the same as those of the substrate voltage generator 101, same reference numerals are indicated and the descriptions of the remaining construction are omitted.

Figure 7:
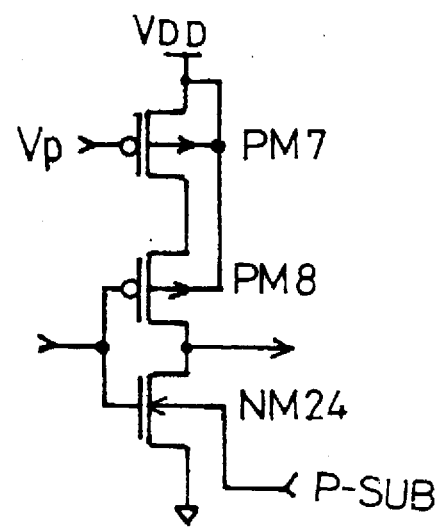
FIG. 7 is a detailed circuit diagram of FIGS. 5 and 6.
Figure 8:
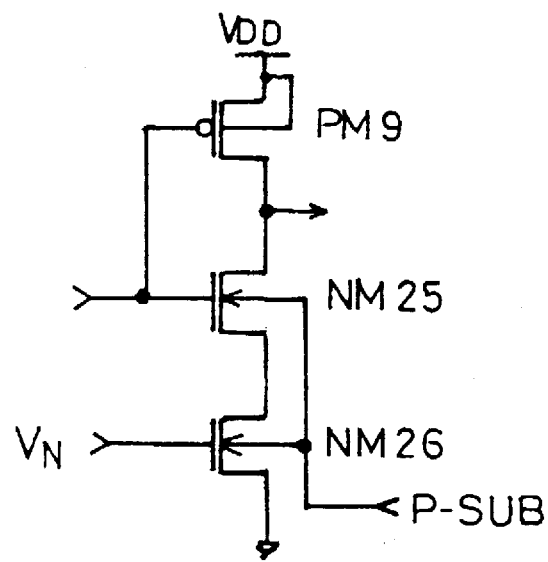
FIG. 8 is another detailed circuit diagram of FIGS. 5 and 6.

FIGS. 7 and 8 are detailed circuit diagrams of inverters I1 to I9 shown in the oscillators 31 and 32 of FIGS. 5 and 6. The inverters I1, I3, I5, I7 and I9 each include a PMOS transistor PM7 having a source to which the supply voltage VDD line is connected, and a gate to which the bias voltage VP generated by the bias voltage generator 11; a PMOS transistor PM8 having a source to which a drain of the PMOS transistor PM7 is connected, and a gate to which each output line of the inverters I9, I2, I4, I6 and I8 is connected; and an NMOS transistor NM24 having a drain to which a drain of the PMOS transistor PM8 is connected and further the output line is connected, a gate to which a gate of the PMOS transistor PM8 is connected, and a source to which the ground terminal is connected.

The inverters I2, I4, I6 and I8 each include a PMOS transistor PM9 having a source to which the supply voltage VDD terminal is connected, and a gate to which each output line of the inverters I1, I3, I5 and I7 is respectively connected; an NMOS transistor NM25 having a drain to which a drain of the PMOS transistor PM9 is connected and further the output line is connected, and a gate to which the gate of the PMOS transistor PM9 is connected; and an NMOS transistor NM26 having a drain to which a source of the NMOS transistor NM25 is connected, a gate to which voltage VN line generated in the bias voltage generator 11 is connected, and a source to which the ground terminal is connected.

The operations of the substrate voltage supply control circuit for the memory according to the present invention will be explained, referring to FIG. 9.

First, in initial state, the PMOS transistor PM1 of the bias voltage generator 11 included in the substrate voltage generator 101 is turned on by the ground voltage applied to its gate, and high voltage is commonly applied to each gate of the NMOS transistors NM1 and NM2, thereby the NMOS transistors NM1 and NM2 are turned on, respectively, and outputs bias voltage VN of low level to drain of the PMOS transistor PM1 and the drain of the NMOS transistor NM1 via common output line.

Further, when the NMOS transistor NM2 is turned on, since low voltage is applied to the gate of the PMOS transistor PM2, the PMOS transistor PM2 is turned on and outputs the bias voltage VP of low level via the output line connected to the gate of the PMOS transistor PM2.

Afterwards, the PMOS transistor PM3 of the clamping voltage generator 21 receives at its gate the low voltage VP outputted via the output line of the bias voltage generator 11 and is turned on, thereby voltage V1 obtained by subtracting a threshold voltage of the PMOS transistor PM3 from the supply voltage VDD is applied to the node N1, as shown in FIG. 5.

While, the PMOS transistor PM4 receives at its gate the low voltage applied to node N2 and is turned on, thereby voltage V2 obtained by subtracting a threshold voltage of the PMOS transistor PM4 from the voltage applied to N1. That is, total threshold voltages of NMOS transistors NM3 to NM8 is applied to the node N2, and the NMOS transistors NM3 to NM8 are turned on, successively.

Accordingly, the NMOS transistor NM9 receives at its gate the voltage V1 applied to the node N1 and is turned on, while, the PMOS transistor PM5 receives at its gate the voltage V2 applied to the node N2 and is turned off.

On the other hand, the PMOS transistor PM6 receives at its gate the low voltage VP applied to the gate of the PMOS transistor PM3, and is turned on.

Thereafter, high voltages each applied to source of the NMOS transistor NM9 and drain of the PMOS transistor PM6 are charged in the capacitor C1, and outputted as high voltage VBLH via output line.

The PMOS transistor PM7 of the inverter I1 as shown in FIG. 7 receives at its gate low voltage VP applied to a gate of the PMOS transistor PM12 of the voltage generator 11, and is turned on. The PMOS transistor PM8 and NMOS transistor NM24 receive at each gate low voltage applied from the inverter I9, and are turned on and turned off, respectively, thereby outputting high voltages via the output line of the inverter I1.

The PMOS transistor PM9 and NMOS transistor NM25 of the inverter I2 shown in FIG. 8 receive at each gate high voltage outputted from the output line of the inverter I1, and are turned on and turned off, respectively. The NMOS transistor NM26 receives at its gate the low voltage VN outputted via the output line of the bias voltage generator 11, and is turned off, thereby outputting low voltage via common output line of the PMOS transistor PM9 and NMOS transistor NM25.

The inverters I3 to I9 invert input voltage successively, and high voltage is outputted via the output terminal of the inverter I9. The outputted high voltage is fed back to input terminal of the inverter I1, and inverters I1 to I9 repeatedly perform the above operations.

As a result, high and low voltages are successively outputted via the output terminal of the inverter I9.

When power supply signal PWUP of high level shown in FIG. 9B is inputted and when in power-up state, the NAND gate ND1 of the voltage pumping circuit 41 NANDs the output voltage of the inverter I9 of the oscillator 31 and the enable voltage EN of high level shown in FIG. 9 to the one input terminal.

Here, when the output voltage of the inverter 19 is low level, the NAND gate ND1 outputs high voltage by NANDing the inputted enable voltage EN of high level and the low voltage, thereby outputting high voltage. The outputted high voltage is inverted by the inverter I10, and low voltage is outputted.

On the other hand, the NMOS transistor NM11 receives at its gate the high voltage VBLH outputted from the clamping voltage generator 21 and is turned on. Further, the NMOS transistor NM10 receives at its gate high voltage and is turned on, thereby the high voltage is applied to each source of the NMOS transistors NM11 and NM12.

Accordingly, the NMOS transistors NM12 and NM13 commonly receive at each gate high voltage applied to each source of the NMOS transistors NM11 and NM12, and are turned on, respectively.

As the NMOS transistors NM12 and NM13 are turned on, high and low voltage are applied to each gate of the MOS capacitors MC1 and MC2, thereby high and low voltages are applied to each drain-source of the MOS capacitors MC1 and MC2.

Afterwards, the NMOS transistor NM14 receives at its gate the high voltage applied to the drain-source of the MOS capacitor MC1 and is turned on, thereby the NMOS transistor NM16 receives at its gate the low voltage and is turned off.

Since the NMOS transistor NM16 is turned off, low voltage is applied to the gate of the NMOS transistor NM18, and the NMOS transistor NM18 is turned off. And, since the NMOS transistor NM18 is turned off, the low voltage applied to drain-source of the MOS capacitor MC2 is applied to the gate of the NMOS transistor NM15, thereby the NMOS transistor NM15 is turned off.

Further, as the NMOS transistor NM18 is turned on, low voltage is applied to a gate of the NMOS transistor NM17, and the NMOS transistor NM17 is turned off.

Meanwhile, the voltage outputted from the inverter I9 is high level, the NAND gate ND1 outputs low voltage by NANDing the inputted high voltages. The outputted low voltage is inverted by the inverter I10 and high voltage is outputted.

The low and high voltages are applied to each gate of the MOS capacitors MC1 and MC2, and further applied to each drain-source of the MOS capacitors MC1 and MC2.

Accordingly, the NMOS transistors NM14 and NM16 receive at each gate the low voltage applied to the drain-source of the MOS capacitor MC1, and are turned off. As the NMOS transistor NM16 is turned off, the NMOS transistor NM18 receives at its gate low voltage, and is turned off. Further, as the NMOS transistor NM18 is turned off, the high voltage applied to the drain-source of the MOS capacitor MC2 is applied to gate of the NMOS transistor NM15, thereby the NMOS transistor NM15 is turned off.

As the NMOS transistor NM18 is turned off, low voltage is applied to gate of the NMOS transistor NM17, thereby the NMOS transistor NM17 is turned off.

As shown in FIGS. 9A to 9D, when in power-up state, the NAND gate ND2 of the logic operator 51 receives at one input terminal the high voltage RASB supplied from the outside, and receives at the other input terminal the low voltage PWUP inverted by the inverter I11. After NANDing the high and low voltages, high voltage is outputted. The outputted high voltage is outputted as high voltage via the inverters I12, and I13, successively.

Thereafter, the NAND gate ND3 of the oscillator 61 receives at one input terminal the high voltage outputted via the inverter I13, and receives at the other input terminal the low voltage outputted from the inverter I15. After NANDing the high and low voltages, high voltage is outputted. The outputted high voltage is outputted as high voltage via the inverters I14 and I15, successively.

High voltage outputted from the inverter I15 is fed back and is applied to the other input terminal of the NAND gate ND3.

Accordingly, the NAND gate ND3 outputs low voltage by NANDing high voltages applied to one input terminal and applied to the other input terminal. The outputted low voltage is then outputted as low voltage via the inverters I14 and I15, successively.

As a result, output level of the inverter I5 is changed to high or low level, successively. According to this change, output level of the inverter I16 is changed to high or low level, successively.

Here, when output of the inverter I6 is low voltage level, the low voltage is outputted as high voltage level via the inverters I17 to I21 of the voltage pumping circuit 71, successively.

On the other hand, the NMOS transistor NM20 receives at its gate the high voltage VBLH outputted via output line of the clamping voltage generator 21, and is turned on. After the NMOS transistor NM20 is turned on, the NMOS transistor NM19 receives at its gate high voltage, and is turned on, thereby high voltage is applied to each source of the NMOS transistors NM19 and NM20.

Thereafter, the NMOS transistor NM21 receives at its gate the high voltage applied to each source of the NMOS transistors NM19 and NM20, and is turned on. After the NMOS transistor NM21 is turned on, the high voltage applied to the output terminal of the inverter I21 is applied to a gate of the MOS capacitor MC3 via the NMOS transistor NM21.

Accordingly, the high voltage is applied to drain-source of the MOS capacitor MC3, and further applied to the gate of the NMOS transistor NM22, and the NMOS transistor NM22 is turned on, while, the NMOS transistor NM23 is turned off by low voltage applied to it own source.

When output of the inverter I16 is high voltage, the high voltage is outputted as low voltage via the inverters I17 to I21 of the voltage pumping circuit 71, successively, and the outputted low voltage is applied to the gate of the MOS capacitor MC3 via the NMOS transistor NM21.

As low voltage is applied to the drain-source of the MOS capacitor MC3, and further applied to the gate of the NMOS transistor NM22, the NMOS transistor NM22 is turned off. And, the NMOS transistor NM23 is turned off by low voltage applied to it own source, thereby high substrate voltage VBBH is outputted via the output line OUT1, as shown in FIG. 5.

On the other hand, the bias voltage generator 12 outputs low voltages VP and VN as the bias voltage generator 11 does.

The PMOS transistor Q1 of the clamping voltage generator 22 receives at its gate the low voltage VP outputted from the bias voltage generator 12, and is turned on. After the PMOS transistor Q1 is turned on, the node N1 receive voltage V3 obtained by subtracting its own threshold voltage from the supply voltage VDD.

The PMOS transistor Q2 receives at its gate the low voltage applied to its own drain, and is turned on. After the PMOS transistor Q2 is turned on, the node N2 receives voltage V4 obtained by subtracting its own threshold voltage from the voltage of the node N1, that is, total threshold voltages of the NMOS transistors Q3 to Q5.

Accordingly, the NMOS transistor Q6 is turned on by voltage V3 of the node N1, and the PMOS transistor Q7 is turned on by the voltage V4 of the node N2, thereby the low voltage VBLL is outputted via the output line.

Afterwards, the NMOS transistor NM11 of the voltage pumping circuit 42 receives at its gate the low voltage VBLL outputted from the clamping voltage generator 22, and is turned off. As the NMOS transistor NM11 is turned off, the NMOS transistor NM10 receives at its gate low voltage and is turned off.

The low voltage is commonly applied to each gate of the NMOS transistors NM12 and NM13, thereby the NMOS transistors NM12 and NM13 are turned off, respectively.

further, the NMOS transistor NM20 of the voltage pumping circuit 72 receives at its gate the low voltage VBH. outputted from the clamping voltage generator 22, and is turned off. As the NMOS transistor NM20 is turned off, low voltage is applied to the gate of the NMOS transistor NM19, thereby the NMOS transistor NM19 is turned off.

Accordingly, the NMOS transistor NM21 receives at its gate low voltage, and is turned off, thereby the low substrate voltage VBBL is outputted via an output line OUT2.

On the other hand, the inverter 201 of the substrate voltage supply control unit 200 receives the high signal RASB as shown in FIG. 9A, and outputs low voltage by inverting the high signal. The outputted low signal is inverted by the inverter 202 and outputted as high signal CS1.

The high signal CS1 outputted from the inverter 202 is inverted to low signal via the inverter I3, and applied to each first input terminal of the NAND gates 14, 17, 20 and 23.

The NAND gate 14 receives address signals Ai and Aj of low level inputted to the second and third input terminals from the outside, and outputs high signal by NANDing the address signals of low level and low signal applied to the first input terminal. The outputted high signal is outputted as the high signal CS2 via the inverters 15 and 16, successively.

The NAND gate 17 receives at its second and third input terminals the address signal AiB of high level and the address signal Aj of low level inputted from the outside, and outputs high signal by NANDing the address signals and low signal applied to the first input terminal. The outputted high signal is outputted as the high signal CS3 via the inverters 18 and 19, successively.

The NAND gate 20 receives at its second and third terminals the address signal Ai of low level and the address signal AjB of high level inputted from the outside, and outputs high signal by NANDing the address signals and low signal applied to the first input terminal. The outputted high signal is outputted as the high signal CS4 via the inverters 21 and 22, successively.

Further, the NAND gate 23 receives at its second and third terminals the address signals AiB and AjB of high level inputted from the outside, and outputs high signal by NANDing the address signals and low signal applied to the first input terminal. The outputted high signal is outputted as the high signal CS5 via the inverters 24 and 25, successively.

Thereafter, the transmission gate TG1 of the multiplexer 301 receives at its PMOS terminal the signal inverted to the low signal by the inverter IN1, and receives at its NMOS terminal the high signal CS1 outputted from the inverter 202, thereby the transmission gate TG1 is turned on, and supplies the high substrate voltage VBBH outputted from the substrate voltage generator 101 to the memory peripheral circuits.

Multiplexers 302 to 305 receive high signals CS2 to CS5 outputted respectively from the inverters 16, 19, 22 and 25, and operate similarly as the multiplexer 301 does. That is, the multiplexers 302 to 305 supply the high substrate voltage VBBH generated in the substrate voltage generator 101 to the word line driver WL, x-decoder X and y-decoder Y.

The operations of the bias voltage generator 11, the clamping voltage generator 21, and the oscillator 31 of the substrate voltage generator 101 in standby state are illustrated above.

On the other hand, the NAND gate ND1 receives at the other input terminal the enable signal EN of low level shown in FIG. 9B, and outputs high voltage regardless of the output level of the inverter I9 in the oscillator 31. The operations of the NMOS transistors NM11 to NM19 and the MOS capacitor MC1 and MC2 are illustrated above, and detailed descriptions are omitted.

The NAND gate ND2 receives at one input terminal the high voltage RASB supplied from the outside, and receives at the other input terminal the high voltage PWUP inverted by the inverter I11, respectively. Thereafter, the NAND gate ND2 outputs low voltage by NANDing the high voltages. The outputted low voltage is outputted as low voltage via the inverters I12 and I13, successively.

The NAND gate ND3 of the oscillator 61 receives at one input terminal the low voltage outputted via the inverter I13, and outputs high voltage regardless of the voltage inputted to the other input terminal. The outputted high voltage is outputted as high voltage via the inverters I14 and I15, successively.

Further, high voltage outputted from the inverter I15 is fed back and applied to the other input terminal of the NAND gate ND3.

Accordingly, the NAND gate ND3 outputs low voltage by NANDing the low voltage applied to one input terminal and the high voltage applied to the other input terminal. The outputted low voltage is outputted as low voltage via the inverters I14 and I15, successively.

As a result, the output of the inverter I15 is maintained in a low level and the output of the inverter I16 is also maintained in a low level, thereby the output of the low level is applied to the voltage pumping circuit 71. Thereafter, the voltage pumping circuit 71 outputs the high substrate voltage VBBH via the out line OUT1, as explained above.

The substrate voltage generator 102 outputs the low substrate voltage VBBL via the output line OUT2, as explained above.

The inverter 201 of the substrate voltage supply control unit 200 continuously receives the high signal RASB, as shown in FIG. 9A. The operations of the substrate voltage supply control unit 200 and the substrate voltage selection unit 300 are illustrated above, and detailed descriptions are omitted.

When in active state, as shown in FIG. 9A to 9D, the substrate voltage generators 101 and 102 output the high substrate voltage VBH and low substrate voltage VBBL, respectively.

On the other hand, the inverter 201 of the substrate voltage supply control unit 200 receives the low sisal RASB, as shown in FIG. 9A, and output high signal by inverting the received low signal. The inverted high signal is outputted as the low signal CS1 by being inverted via the inverter 202.

Further, the low signal CS1 outputted from the inverter 202 is inverted by the inverter 13, and the inverted high signal is applied to each first input terminal of the NAND gates 14, 17, 20 and 23.

The NAND gate 14 receives at the second and third input terminals the address signals Ai and Aj of low level inputted from the outside, and outputs high signal by NANDing the address signals and the high signal applied to the first input terminal. The outputted high signal is outputted as the high signal CS2 via the inverters 15 and 16, successively.

The NAND gate 17 receives at the second and third input terminals the address signal AiB of high level and the address signal Aj of low level inputted from the outside, and outputs high signal by NANDing the address signals and high signal applied to the first input terminal. The outputted high signal is outputted as the high signal CS3 via the inverters 18 and 19, successively.

The NAND gate 20 receives at the second and third input terminals the address signal Ai of low level and the address signal AjB of high level inputted from the outside, and outputs high signal by NANDing the address signals and high signal applied to the first input terminal. The outputted high signal is outputted as the high signal CS4 via the inverters 21 and 22, successively.

The NAND gate 23 receives at the second and third input terminals the address signals AiB and AjB of high level inputted from the outside, and outputs low signal by NANDing the address signals and the high signal applied to the first input terminal. The outputted low signal is outputted as the low signal CS5 via the inverters 24 and 25, successively.

Thereafter, the transmission gate TG2 of the multiplexer 301 receives at its NMOS terminal the high signal inverted by the inverter IN1 and receives at its PMOS terminal the low signal CS1 outputted from the inverter 202, thereby turned on. After being turned on, the transmission gate TG2 supplies the low substrate voltage VBBH outputted from the substrate voltage generator 102 to the memory peripheral circuit.

The multiplexers 302 to 304 receive high signals CS2 to CS4 outputted respectively from the inverters 16, 19 and 22, and supply the high substrate voltage VBBH generated by the substrate voltage generator 101 to the word line driver WL, x-decoder X, and y-decoder Y.

Meanwhile, the multiplexer 305 receives the low signal CS5 outputted from the inverter 25, and supplies the low substrate voltage VBBL generated by the substrate voltage generator 102 to the word line driver WL, Y-decoder and Y-decoder.

As described above, according to the present invention, the substrate voltage supply control circuit for a memory includes substrate voltage generating circuit inside of the memory to supply the substrate voltage having different voltage levels depending on the state of each circuit. Further, when in active state, the circuit according to the present invention supplies high substrate voltage for the path which is not decoded, and supplies low substrate voltage for the path which is decoded, thereby reducing the electrical power consumption in memory.

What is claimed is:

1. A substrate voltage supply control circuit for a memory comprising:

first and second substrate voltage generating means for generating substrate voltages of high level and low level, respectively, according to a row address strobe signal, a power supply sisal and an enable signal applied externally, and supplying the generated substrate voltage of high level to memory cells;

a substrate voltage supply control means for outputting first to fifth control signals and supplying the substrate voltages of high and low levels generated respectively by said first and second substrate voltage generating means to each circuit inside of the memory according to said row address strobe signal and first to fourth address signals applied from the outside; and a substrate voltage selection means for selecting corresponding ones of the substrate voltages of high and low levels generated respectively by said first and second substrate voltage generating means according to said first to fifth control signals outputted from said substrate voltage supply control means, and respectively supplying the selected voltages to a word line driver, an x-decoder, a y-decoder and memory peripheral circuits.

2. The circuit of claim 1, wherein said first substrate voltage generating means includes:

a bias voltage generator for generating first and second bias voltages;

a clamping voltage generating means for clamping the first bias voltage generated by said bias voltage generator, and generating a constant high voltage;

a first oscillator for outputting an oscillation signal by being oscillated in standby and active states in accordance with said first and second bias voltages respectively generated in said bias voltage generator;

a first pumping circuit for logically operating the signal oscillated in said first oscillator and an enable signal applied from the outside, and outputting the high substrate voltage by pumping the logically operated signal in accordance with the high voltage generated by said clamping voltage generator;

a logic operator for logically operating said row address strobe signal and power supply signal supplied from the outside;

a second oscillator being oscillated in accordance with the signal which is logically operated in said logic operator in active state; and a second voltage pumping circuit for outputting voltage to be combined with said a high substrate voltage by pumping the voltage oscillated in said second oscillator in accordance with the voltage generated by said clamping voltage generator.

3. The circuit of claim 2, wherein said bias voltage generator includes:

a first PMOS transistor having a source to which a supply voltage is connected, and a gate to which a ground terminal is connected;

a first NMOS transistor having a drain to which a drain of said first PMOS transistor is connected and further a first output line is connected, a gate to which said first output line is connected, and a source to which the ground terminal is connected;

a second PMOS transistor having a source to which the supply voltage terminal is connected, and a gate to which its own drain is connected and further a second output line is connected; and a second NMOS transistor having a drain to which the drain of said second PMOS transistor is connected, a gate to which the gate of said first NMOS transistor is connected, and a source to which the ground terminal is connected.

4. The circuit of claim 2, wherein said clamping voltage generator includes:

a first PMOS transistor having a source to which a supply voltage is connected, and a gate to which an output line of said first bias voltage is connected;

a second PMOS transistor having a source to which a drain of said first PMOS transistor is connected and further a first output line is connected, and a gate to which its own drain is connected;

a first NMOS transistor having a drain to which the drain of said second PMOS transistor is connected and further a second output line is connected, and a gate to which its own drain is connected;

a second NMOS transistor having a drain to which a source of said first NMOS transistor is connected, and a gate to which its own drain is connected;

a third NMOS transistor having a drain to which a source of said second NMOS transistor is connected, and a gate to which its own drain is connected;

a fourth NMOS transistor having a drain to which a source of said third NMOS transistor is connected, and a gate to which its own drain is connected;

a fifth NMOS transistor having a drain to which a source of said fourth NMOS transistor is connected, and a gate to which its own drain is connected;

a sixth NMOS transistor having a drain to which a source of said fifth NMOS transistor is connected, a gate to which its own drain is connected, and a source to which a ground terminal is connected;

a seventh NMOS transistor having a drain to which the supply voltage is connected, and a gate to which said first output line is connected;

a third PMOS transistor having a source to which a source of said seventh NMOS transistor is connected and further a third output line is connected, and a gate to which said second output line is connected;

a resistor having one end to which the source of said third PMOS transistor is connected, and the other end to which the ground terminal is connected;

a capacitor being connected in parallel between said third output line and the ground terminal; and a fourth PMOS transistor having a source to which the supply voltage terminal is connected, a gate to which the output line of said first bias voltage is connected, and a drain to which said third output line is connected.

5. The circuit of claim 2, wherein said first oscillator includes:

a first inverter for inverting the signal inputted by voltage generated in said bias voltage generator;

a second inverter for inverting the signal which is inverted in said first inverter by the second bias voltage generated in said bias voltage generator;

a third inverter for inverting the signal inverted in said second inverter by the first bias voltage generated in said bias voltage generator;

a fourth inverter for inverting the signal inverted in said third inverter by the second bias voltage generated in said bias voltage generator;

a fifth inverter for inverting the signal inverted in said fourth inverter by the first bias voltage generated in said bias voltage generator;

a sixth inverter for inverting the signal inverted in said fifth inverter by the second bias voltage generated in said bias voltage generator;

a seventh inverter for inverting the signal inverted in said sixth inverter by the first bias voltage generated in said bias voltage generator;

an eighth inverter for inverting the signal inverted in said seventh inverter by the second bias voltage generated in said bias voltage generator, and a ninth inverter for inverting the signal inverted in said eighth inverter by the first bias voltage generated in the bias voltage generator.

6. The circuit of claim 5, wherein said first, third, fifth, seventh and ninth inverters each include:

a first PMOS transistor having a source to which a supply voltage terminal is connected, and a gate to which the output line of the first bias voltage generated by said bias voltage generator;

a second PMOS transistor having a source to which a drain of said first PMOS transistor is connected, and a gate to which the corresponding output line of said ninth, second, fourth, sixth, and eighth inverters is connected; and an NMOS transistor having a drain to which a drain of said second PMOS transistor is connected and further the output line is connected, a gate to which a gate of said second PMOS transistor is connected, and a source to which a ground terminal is connected.

7. The circuit of claim 5, said second, fourth, sixth and eighth inverters each includes:

a first PMOS transistor having a source to which a supply voltage is connected, and a gate to which the corresponding output line of said first, third, fifth and seventh inverters is respectively connected;

a first NMOS transistor having a drain to which a drain of said first PMOS transistor is connected and further the output line is connected, and a gate to which the gate of said first PMOS transistor is connected; and a second NMOS transistor having a drain to which a source of said first NMOS transistor is connected, a gate to which the output line of said second bias voltage generated by said bias voltage generator is connected, and a source to which a ground terminal is connected.

8. The circuit of claim 2, wherein said first voltage pumping circuit includes:

a NAND gate having one input terminal to which the signal outputted from said first oscillator is connected, and the other input terminal to which said enable signal inputted from the outside is connected;

an inverter having an input terminal to which output terminal of said NAND gate is connected;

a first NMOS transistor having a drain to which the output voltage of said clamping voltage generator is connected, and a gate to which its own source is connected;

a second NMOS transistor having a drain to which the drain of said first NMOS transistor is connected and further its own gate is connected, and a source to which the source of said first NMOS transistor is connected;

a third NMOS transistor having a drain to which output terminal of said NAND gate is connected, and a gate to which each source of said first and second NMOS transistors is commonly connected;

a fourth NMOS transistor having a drain to which output terminal of said inverter is connected, and a gate to which the gate of said third NMOS transistor is connected;

a first MOS capacitor having a gate to which a source of said third NMOS transistor is connected;

a second MOS capacitor having a gate to which a source of said fourth NMOS transistor is connected;

a fifth NMOS transistor having a drain to which a drain-source of said first MOS capacitor is connected, a gate to which its own drain is connected, and a source to which the ground terminal is connected;

a sixth NMOS transistor having a drain to which a drain-source of said second MOS capacitor is connected, a gate to which its own drain is connected, and a source to which a ground terminal is connected;

a seventh NMOS transistor having a drain to which the drain of said sixth NMOS transistor is connected, and a gate to which the gate of said fifth NMOS transistor is connected;

an eighth NMOS transistor having a drain to which the gate of said seventh NMOS transistor is connected, and a gate to which its own source is connected; and a ninth NMOS transistor having a drain to which the gate of said sixth NMOS transistor is connected, a gate to which a source of said seventh NMOS transistor is connected, and a source to which its own gate is connected and further output line of the substrate voltage of high level is connected.

9. The circuit of claim 2, wherein said logic operator includes:

a NAND gate for NANDing said row address strobe signal inputted from the outside which is inverted by a first inverter; and second and third inverters for inverting successively the signal outputted from said NAND gate.

10. The circuit of claim 2, wherein said second oscillator includes:

a NAND gate for NANDing the signal outputted from said logic operator and the signal inputted after being fed back;

first and second inverters for inverting the signal outputted from said NAND gate, and outputting the inverted signal back to said NAND gate; and a third inverter for inverting the signal outputted from said second inverter.

11. The circuit of claim 2, wherein said second voltage pumping circuit includes:
- first to fifth inverters for successively inverting the signal outputted from said second oscillator;
- a first NMOS transistor having a drain to which the voltage line outputted from said clamping voltage generator is connected, and a gate to which its own source is connected;
- a second NMOS transistor having a drain to which the drain of said first NMOS transistor is connected, a gate to which its own drain is connected, and a source to which the source of said first NMOS transistor is connected;
- a third NMOS transistor having a drain to which output terminal of said fifth inverter is connected, and a gate to which each source of said first and second NMOS transistors is commonly connected;
- a first MOS capacitor having a gate to which a source of said third NMOS transistor is connected;
- a fourth NMOS transistor having a drain to which a drain-source of said first MOS capacitor is connected, a gate to which its own drain is connected, and a source to which ground terminal is connected;
- a fifth NMOS transistor having a drain to which the drain of said fourth NMOS transistor is connected, and a gate to which its own source is connected; and
- a second MOS capacitor being connected between the gate of said fifth NMOS transistor and the ground terminal, and further connected to the output line of the substrate voltage of high level.

12. The circuit of claim 1, wherein said second substrate voltage generating means includes:
- a bias voltage generator for generating first and second bias voltages;
- a clamping voltage generating means for clamping said first bias voltage generated by said bias voltage generator, and generating a prescribed low voltage;
- a first oscillator being oscillated in standby and active states in accordance with said first and second bias voltages generated by said bias voltage generator, and outputting an oscillation signal;
- a first voltage pumping circuit for logically operating the signal oscillated in said first oscillator with the enable signal applied from the outside, and outputting a prescribed low substrate voltage by pumping the logically operated signal by the low voltage generated in said clamping voltage generator;
- a logic operator for logically operating said row address strobe signal and power supply signal supplied from the outside;
- a second oscillator being oscillated in accordance with the signal which is logically operated in said logic operator in active state; and
- a second voltage pumping circuit for outputting voltage to be combined with said a prescribed low substrate voltage by pumping the voltage oscillated in said second oscillator by the low voltage generated in said clamping voltage generator.

13. The circuit of claim 12, wherein said clamping voltage generator includes:
- a first PMOS transistor having a source to which a supply voltage is connected, and a gate to which the output line of said first bias voltage is connected;
- a second PMOS transistor having a source to which a drain of said first PMOS transistor is connected and further a first output line is connected, and a gate to which its own drain is connected;
- a first NMOS transistor having a drain to which a drain of said second PMOS transistor is connected and further a second output line is connected, and a gate to which its own drain is connected;
- a second NMOS transistor having a drain to which a source of said first NMOS transistor is connected, and a gate to which its own drain is connected;
- a third NMOS transistor having a drain to which a source of said second NMOS transistor is connected, and a gate to which its own drain is connected;
- a fourth NMOS transistor having a drain to which the supply voltage is connected, and a gate to which said first output line is connected;
- a third PMOS transistor having a source to which a source of said fourth NMOS transistor is connected and further a third output line is connected, and a gate to which said second output line is connected;
- a resistor having one end to which the source of said third PMOS transistor is connected, and the other end to which a ground terminal is connected;
- a capacitor being connected in parallel between said third output line and the ground terminal; and
- a fourth PMOS transistor having a source to which the supply voltage terminal is connected, a gate to which the output line of said first bias voltage is connected, and a drain to which said third output line is connected.

14. The circuit of claim 1, wherein said substrate voltage control means includes:
- first and second inverters for successively inverting said row address strobe signal inputted externally, and outputting a first control signal; and
- a decoding means for decoding first to fourth address signals inputted externally in accordance with the first control signal outputted from said second inverter, and outputting second to fifth control signals.

15. The circuit of claim 14, wherein said decoding means includes:
- a first inverter for inverting a first control signal;
- a first NAND gate for NANDing the signal inverted by said first inverter and the first address signals inputted externally;
- second and third inverters for successively inverting the signal outputted from said first NAND gate and outputting a second control signal;
- a second NAND gate for NANDing the signal inverted by said first inverter and the second address signals inputted externally;
- fourth and fifth inverters for successively inverting the signal outputted from said second NAND gate and outputting a third control signal;
- a third NAND gate for NANDing the signal outputted from said first inverter and the third address signals inputted externally;
- sixth and seventh inverters for successively inverting the signal outputted from said third NAND gate and outputting a fourth control signal;
- a fourth NAND gate for NANDing the signal outputted from said first inverter and the fourth address signals inputted externally; and
- eighth and ninth inverters for successively inverting the signal outputted from said fourth NAND gate and outputting a fifth control signal.

16. The circuit of claim 1, wherein said substrate voltage selection means includes:
- a first multiplexer for selecting one of the substrate voltages of high and low levels respectively outputted from said first and second substrate voltage generating means in accordance with the first control signal outputted from said substrate voltage supply control means, and supplying it to the peripheral circuit inside of the memory; and
- second to fifth multiplexers for selecting one of the substrate voltages of high and low levels generated respectively by said first and second substrate voltage generating means in accordance with the second to fifth control signals outputted from said substrate voltage supply control means, and supplying it respectively to the word line driver, x-decoder and y-decoder.

17. The circuit of claim 16, wherein said first to fifth multiplexers each include:
- first and second transmission gates for respectively transmitting the substrate voltages of high and low levels generated respectively by said first and second substrate voltage generating means in accordance with first to fifth control signals inverted by a first inverter and said first to fifth control signals.

* * * * *